(12) United States Patent  
Tsai et al.

(10) Patent No.: US 11,693,042 B2  
(45) Date of Patent: Jul. 4, 2023

(54) IMAGE TEST SYSTEM, TEST ASSEMBLY AND IMAGE CAPTURE CARD

(71) Applicant: King Yuan Electronics Co., Ltd., Hsinchu (TW)

(72) Inventors: Pin-Yan Tsai, Hsinchu (TW); Kuang-Che Cheng, Hsinchu (TW)

(73) Assignee: KING YUAN ELECTRONICS CO, LTD., Hsinchu (TW)

( * ) Notice: Subject to any disclaimer, the term of this patent is extended or adjusted under 35 U.S.C. 154(b) by 4 days.

(21) Appl. No.: 17/472,746

(22) Filed: Sep. 13, 2021

(65) Prior Publication Data

US 2022/0155361 A1 May 19, 2022

(30) Foreign Application Priority Data

Nov. 13, 2020 (TW) ................................. 109139734

(51) Int. Cl.
*G01R 31/26* (2020.01)
*G01R 31/28* (2006.01)
*G01R 31/308* (2006.01)

(52) U.S. Cl.
CPC ......... *G01R 31/26* (2013.01); *G01R 31/2886* (2013.01); *G01R 31/308* (2013.01)

(58) Field of Classification Search
CPC .. G01R 31/26; G01R 31/2886; G01R 31/308; G01R 31/2889; G01R 31/31727; G01R 31/31725; G01R 31/3177; G01R 31/31922; G06V 10/12

See application file for complete search history.

(56) References Cited

U.S. PATENT DOCUMENTS

| | | | | |
|---|---|---|---|---|
| 5,532,765 A | * | 7/1996 | Inoue | H04N 9/317 348/E17.005 |
| 2011/0228105 A1 | * | 9/2011 | Ito | H04L 7/0008 348/207.1 |
| 2013/0286220 A1 | * | 10/2013 | Zhu | H04N 17/002 348/187 |
| 2016/0028980 A1 | * | 1/2016 | Kameyama | H04N 5/378 341/122 |
| 2019/0158722 A1 | * | 5/2019 | Jung | H04N 5/3765 |

FOREIGN PATENT DOCUMENTS

TW 200734658 A 9/2007
TW I702546 B 8/2020

* cited by examiner

Primary Examiner — Akm Zakaria
(74) Attorney, Agent, or Firm — Bacon & Thomas, PLLC

(57) ABSTRACT

An image test system includes a test assembly and an image capture card. The test assembly is provided for obtaining a test signal from a test object, and includes an interface conversion circuit for converting signal transmission form of the test signal. The image capture card is provided for obtaining the test signal from the test assembly, and obtaining an image data from the test signal. The image test system further includes a test signal clock generation circuit for obtaining a test signal clock from the test signal, or the image capture card further includes a pair of clock input pins for obtaining the test signal clock directly from the test object.

16 Claims, 10 Drawing Sheets

IMAGE TEST SYSTEM, TEST ASSEMBLY AND IMAGE CAPTURE CARD

BACKGROUND OF THE INVENTION

1. Field of the Invention

The present invention relates to a test system, and a test assembly and data capture card thereof. More particularly, the present relates to an image test system, and a test assembly and an image capture card thereof.

2. Description of Related Art

Typically, an image capture card incorporated with the semiconductor test device is provided with a logic processing unit for decoding image signal captured from an image-capture component (such as a camera) in advance. The decoded image signal is then transmitted to a back-end image processing device for further processing. Therefore, at present, image testing is an important part among testing items for semiconductor devices. In order to meet the demand of ultrahigh image quality, transmission of image signal has been gradually proceeded in a form of C-type physical layer (hereinafter referred to as "C-PHY") signal, so as to replace the original form of D-type physical layer (hereinafter referred to as "D-PHY") signal. Currently, D-PHY signal is transmitted in a differential transmission manner, and the clock data is provided for a test system to perform a timing correction of image data. In comparison, the C-PHY signal is not subject to differential transmission, so that the C-PHY signal is suitable only for a short signal transmission path (in comparison with the D-PHY signal). In addition, at present, the C-PHY signal is only provided with data information but not provided with clock information for correction.

Under the current image test system architecture, the image capture card may capture C-PHY signal through a test assembly (for example a prober) and then, through a data conversion unit, the C-PHY signal may be converted into signal having a form capable of being read by the logic processing unit in the image capture card. However, under the limitation of substrate layout, a longer data transmission path may exist between the prober and the data conversion unit, resulting in more energy consumption and delay for the C-PHY signal due to the longer data transmission path. Besides, the problem of jitter may occur because of the offset of signal timing, which adversely affects the accuracy of the test system. Even though a clock generator is arranged in the data conversion unit to generate a correction clock (e.g. ideal clock), the correction clock may not be aligned with the delayed C-PHY signal.

Therefore, it is desirable to provide an improved image test system, test assembly and image capture card to mitigate and/or obviate the aforementioned problems.

SUMMARY OF THE INVENTION

The object of the present invention is to provide an image test system, which comprises a test assembly and an image capture card. The test assembly is provided for obtaining a test signal from a test object, and comprises an interface conversion circuit for converting a signal transmission form of the test signal. The image capture card is provided for obtaining the test signal from the test assembly, and for obtaining an image data from the test signal. The image test system further comprises a test signal clock generation circuit for obtaining a test signal clock from the test signal, or the image capture card further comprises a pair of clock input pins for obtaining the test signal clock directly from the test object.

Another object of the present invention is to provide a test assembly arranged in an image test system, wherein the image test system comprises an image capture card. The test assembly comprises a first transmission interface, a test signal clock generation circuit, an interface conversion circuit and a second transmission interface. The first transmission interface is provided for obtaining a test signal from a test object. The test signal clock generation circuit is provided for obtaining a test signal clock from the test signal, and for transmitting the test signal clock to the image capture card. The interface conversion circuit is provided for converting a signal transmission form of the test signal. The second transmission interface is provided for transmitting the test signal to the image capture card.

Another object of the present invention is to provide an image capture card arranged in an image test system, wherein the image test system comprises a test assembly for transmitting a test signal to the image capture card. The image capture card comprises a test signal clock generation circuit and a logic processing unit. The test signal clock generation circuit is provided for obtaining the test signal clock from the test signal. The logic processing unit is provided for obtaining an image data from the test signal according to the test signal clock.

Other objects, advantages, and novel features of the invention will become more apparent from the following detailed description when taken in conjunction with the accompanying drawings.

DETAILED DESCRIPTION OF THE PREFERRED EMBODIMENT

Different embodiments of the present invention are provided in the following description. These embodiments are meant to explain the technical content of the present invention, but not meant to limit the scope of the present invention. A feature described in an embodiment may be applied to other embodiments by suitable modification, substitution, combination, or separation.

The term "connected" as used herein refers to aspects such as direct connection or indirect connection, and is not limited thereto. The term "when . . ." herein may denote "during the time that . . .", "before . . .", or "after . . ." and is not limited thereto.

In the specification of the present invention, the ordinal numbers, such as "first" or "second", are used to distinguish a plurality of elements having the same name, and it does not mean that there is essentially a level, a rank, an executing order, or an manufacturing order among the elements, except otherwise specified.

Figure 1:
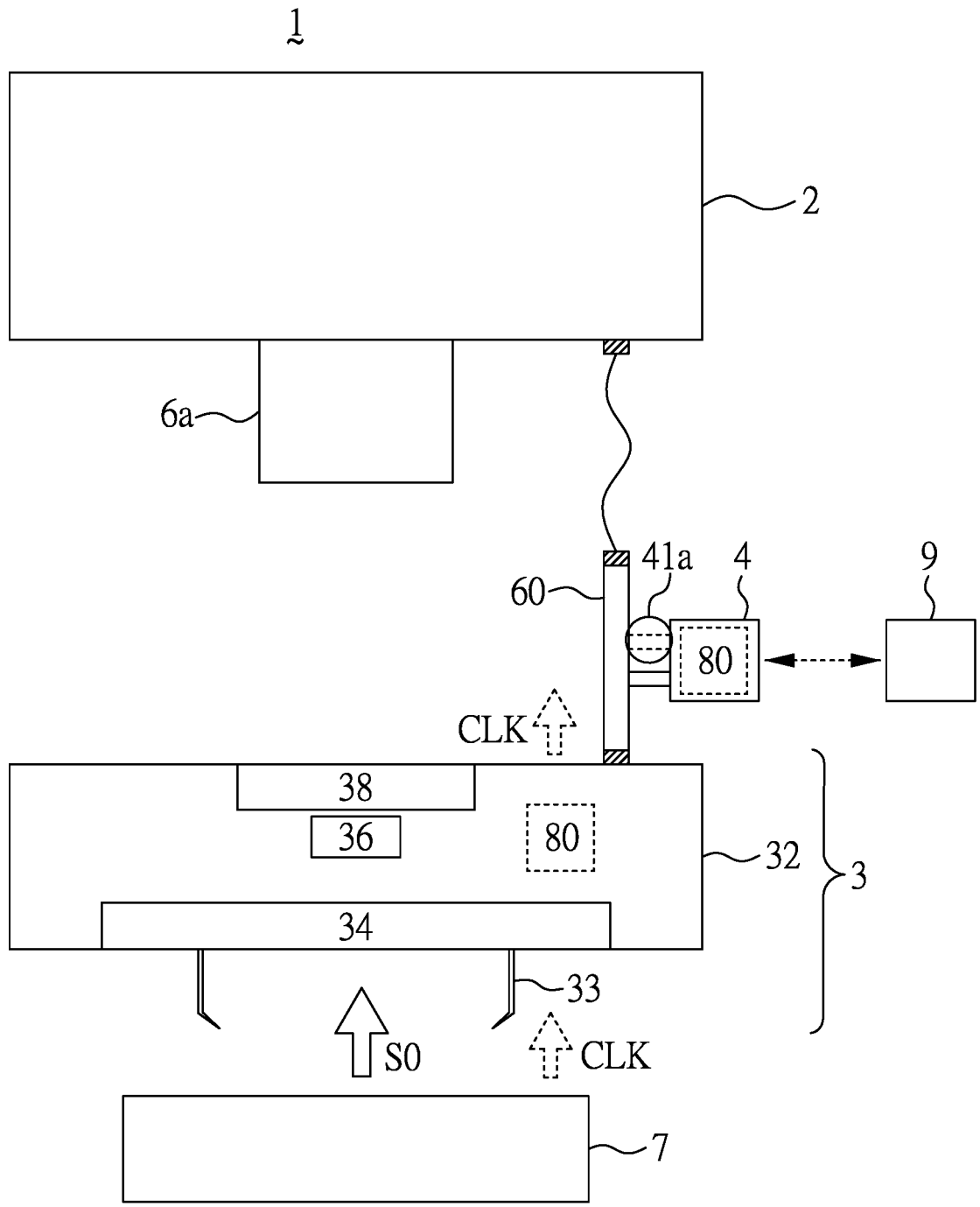
FIG. 1 is a schematic diagram illustrating the basic structure of the image test system according to an embodiment of the invention.

FIG. 1 schematically illustrates the basic structure of the image test system 1 according to an embodiment of the present invention. As shown in FIG. 1, the image test system 1 comprises a test head 2, a test assembly 3, and an image capture card 4. The test assembly 3 is provided for contacting a test object 7, wherein the test object 7 may be a wafer or other semiconductor components required to be processed with an electric test. The test head 2 may provide the test procedures of electric test to the test assembly 3. The test assembly 3 is provided for obtaining a test signal SO from the test object 7. The image capture card 4 is provided for obtaining image data from the test signal SO. For example, when the test object 7 is an image sensor, the image capture card 4 may obtain, from the test signal S0, image data photographed by the test object 7, and convert the image data into a data form suitable for an image processing unit 9 (such as an external computer) at the rear end. Furthermore, when the test object 7 is the processing chip of a display, the image capture card 4 may obtain, from the test signal S0, image data currently played by the display, and convert the image data into a data form suitable for the image processing unit 9 (such as a computer processor) at the rear end. However, these examples are proposed only for the purpose of exemplification rather than of limitation.

The test head 2 may be configured with various interface cards for providing essential test procedures, such as, but not limited to, pin electronics cards (PE cards), device power supply cards (DPS cards), sequence test cards (SEQ cards), etc.

The test assembly 3 may be a prober, and includes a probe card 32, or the test assembly 3 may be the probe card 32 itself, but it is not intended to be so limited. The probe card 32 may be provided with a plurality of probes 33, and the probes 33 may be in contact with the pins of the test object 7, so that the test head 2 may perform an electric test on the test object 7. Besides, the image test system 1 may also comprise a light source supply device 6a, wherein the light source supply device 6a may be, but not limited to, a tube-like light source supply device arranged on the test head 2. In one embodiment, the light source supply device 6a focuses the light source on the test object 7 (e.g. integrated circuit image sensors on wafer) for testing the actual receiving range of the image sensor of the test object 7, so as to proceed with an overall image test. The probe card 32 may obtain a test signal from the image sensor of the test object 7, wherein the test signal is a C-PHY signal. In addition, in one embodiment, the image capture card 4 may be an image capture card of the Mobile Industry Processor Interface (MIPI), and may be connected with the probe card 32 through a first bridge board 60, but it is not intended to be so limited. Further, the test assembly 3 may comprise a first transmission interface 34, an interface conversion circuit 36, and a second transmission interface 38. The first transmission interface 34 may obtain the test signal S0 received by the probes 33. The interface conversion circuit 36 is connected with the first transmission interface 34. The second transmission interface 38 is connected with the interface conversion circuit 36. The image capture card 4 is connected with the second transmission interface 38 to obtain the test signal S0 from the second transmission interface 38. The first transmission interface 34 and the second transmission interface 38 correspond to different signal transmission forms, and the interface conversion circuit 36 may be provided for converting the signal transmission form of the test signal S0.

Figure 2A:
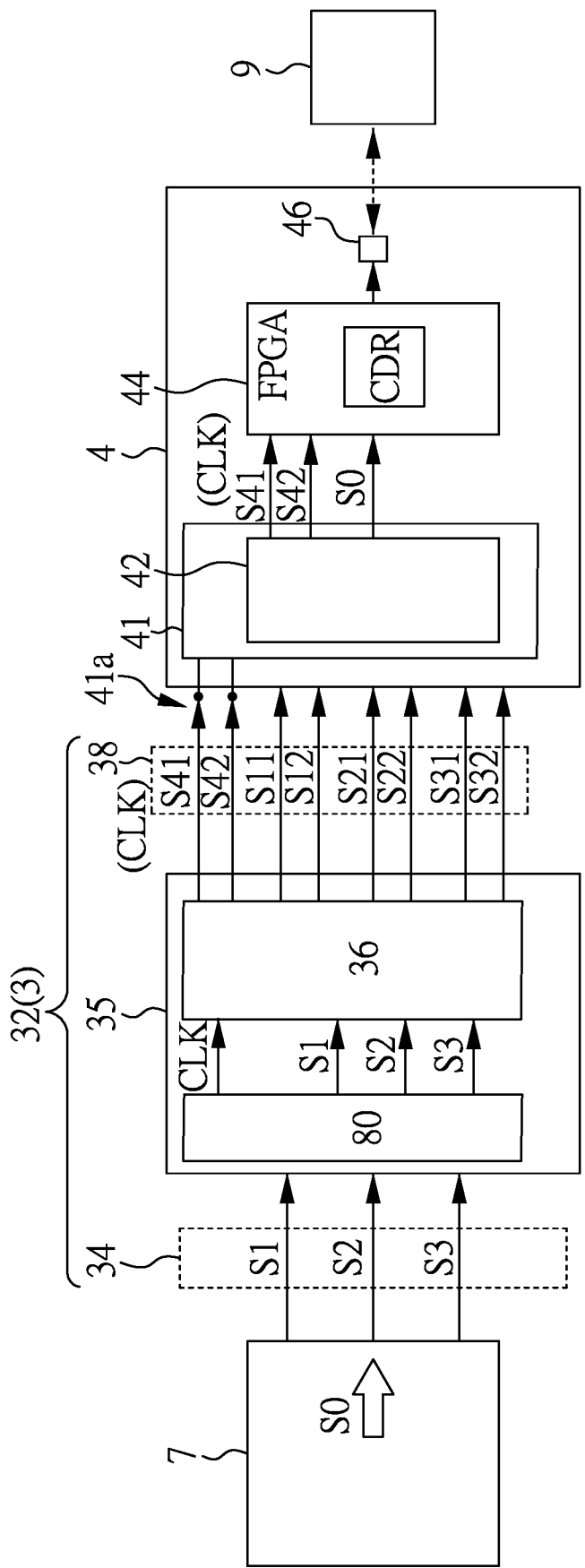
FIG. 2(A) is a schematic diagram illustrating the detail structure of the test assembly and the image capture card according to a first embodiment of the invention.

One of the features of the present invention is the improvement of the test assembly 3 or the image capture card 4. In one embodiment, the image test system 1 further comprises a test signal clock generation circuit 80 provided for obtaining a test signal clock CLK (as shown in FIG. 2(A)) from the test signal S0. The test signal clock generation circuit 80 may be arranged in the test assembly 3 or the image capture card 4. In another embodiment, the image capture card 4 may comprise a pair of clock input pins 41a provided for obtaining the test signal clock CLK directly from the test object 7.

To illustrate the effect of the present invention, a comparison between an embodiment of the present invention and a comparative example is described as follows.

First, the embodiment of the present invention is described. FIG. 2(A) is a schematic diagram illustrating the detail structure of the test assembly 3 and image capture card 4 according to a first embodiment of the present invention. In the first embodiment, the test signal clock generation circuit 80 is arranged in the test assembly 3.

As shown in FIG. 2(A), the first transmission interface 34 is provided for obtaining the test signal S0 obtained from the test object 7, and transmitting the test signal S0 in a first signal transmission form to the test signal clock generation circuit 80. In one embodiment, the first transmission interface 34 is a Mobile Industry Processor Interface C-PHY Interface (MIPI C-PHY interface), and includes a 3-wires serial signal channel. Thus, the test signal S0 is divided into three sub-signals S1, S2 and S3 (hereinafter referred to as a first sub-signal S1, a second sub-signal S2 and a third sub-signal S3) for transmission. The test signal clock generation circuit 80 transmits the test signal S0 (i.e. the sub-signals S1, S2 and S3) to the interface conversion circuit 36, and obtains the test signal clock CLK from the test signal S0. The interface conversion circuit 36 is provided for converting the test signal S0 from the first signal transmission form into a second signal transmission form, and transmitting the test signal S0 (i.e. S1, S2 and S3) to the second transmission interface 38. Besides, the interface conversion circuit 36 may also convert the test signal clock CLK into the second signal transmission form, and transmits the test signal clock CLK to the second transmission interface 38. In one embodiment, the second transmission interface 38 is a high speed logic interface having multiple pairs of high speed logic signal channels, wherein each pair of high speed logic signal channels may form a differential logic signal channel.

Thus, the first sub-signal S1 is divided into a pair of differential sub-signals S11, S12 for transmission; the second sub-signal S2 is divided into a pair of differential sub-signals S21, S22 for transmission; the third sub-signal S3 is divided into a pair of differential sub-signals S31, S32 for transmission; and the test signal clock CLK is divided into a pair of differential sub-signals S41, S42 for transmission.

It is noted that, the test signal clock CLK is obtained directly from the test signal S0, and is transmitted to the image capture card 4 through the same transmission path (e.g. the transmission path of the test signal S0), so that the timing of the test signal clock CLK is substantially corresponding to the timing of the test signal S0. In this disclosure, the meaning of "A is substantially corresponding to B" denotes that A is consistent with B or there may be a few difference between A and B (e.g. the difference is less than 5%, 3% or 1%, though it is not intended to be so limited).

In one embodiment, the test assembly 3 comprises a probe card sub-board 35. The test signal clock generation circuit 80 and the interface conversion circuit 36 are arranged in the probe card sub-board 35, though it is not intended to be so limited. The arrangement of the probe card sub-board 35 is advantageous in that the configuration of the components on the test assembly 3 becomes more flexible.

Besides, the image capture card 4 comprises a logic input interface 41, a logic processing unit 44 and a transmission unit 46. The logic input interface 41 comprises a plurality of pins and a data conversion circuit 42, wherein part of the plurality of pins is provided for receiving the test signal S0 (S11~S32) and the test signal clock CLK (S41, S42) from the test assembly 3, and the data conversion circuit 42 is provided for converting the test signal S0 and the test signal clock CLK from the second signal transmission form into a data form suitable for the logic processing unit 44. In one embodiment, if the second signal transmission form is suitable for the logic processing unit 44, the second signal transmission form can be maintained. For the convenience of explanation, in the following paragraphs, "the test signal clock CLK in the second signal transmission form (e.g. differential form) is transmitted to the logic processing unit 44" is given as an example to describe the invention. Besides, the data form of the test signal S0 is not limited to be in single signal form. The logic processing unit 44 is provided for obtaining the image data from the test signal S0 according to the test signal S0 and the test signal clock CLK. The transmission unit 46 transmits the image data to the image processing components 9 (such as an external computer). In one embodiment, the transmission unit 46 is an optical fiber interface, though it is not intended to be so limited.

In this embodiment, the image capture card 4 has a pair of additional clock input pins 41a for receiving the test signal clock CLK (S41, S42) from the test assembly 3. Moreover, in this embodiment, the logic processing unit 44 is a field programmable gate array (FPGA) chip with sufficient pins for receiving the test signal S0 and the test signal clock CLK (S41, S42), so that there are no additional pins required to be added to the logic processing unit 44.

Figure 2B:
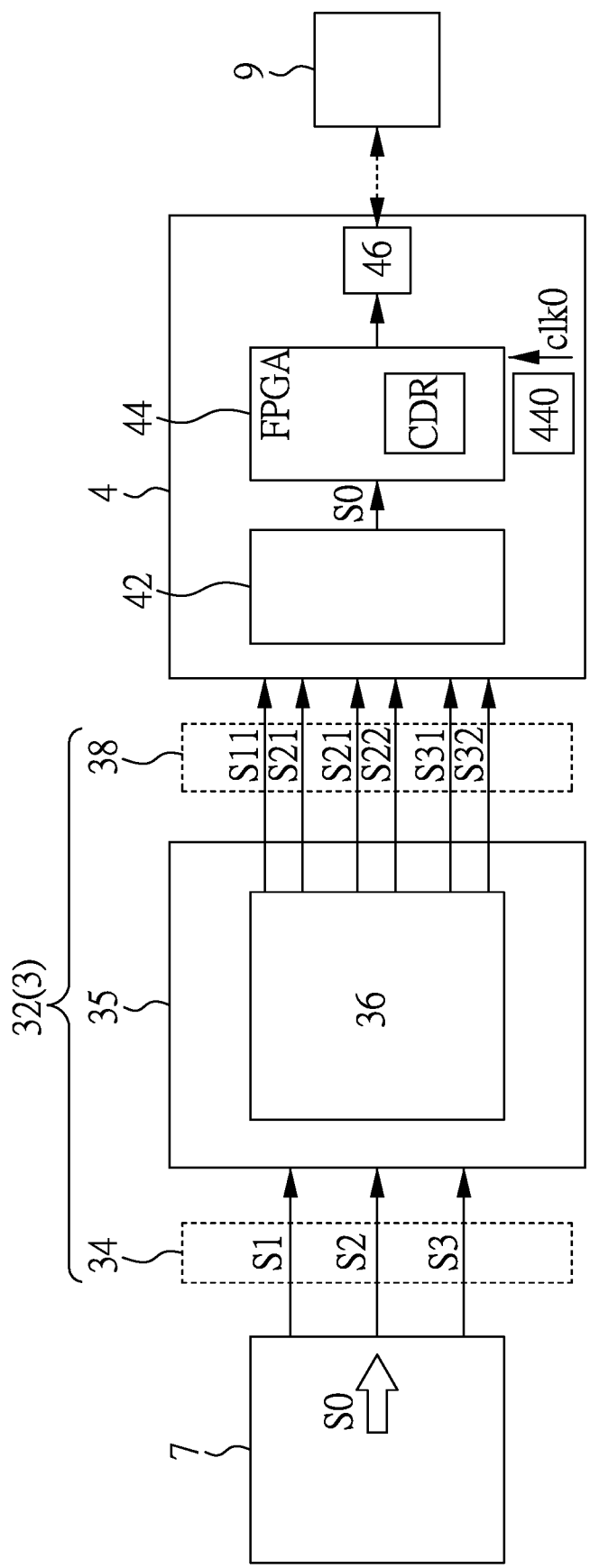
FIG. 2(B) is a schematic diagram illustrating the test assembly and the image capture card of a comparative example.

Then, the comparative example is described. FIG. 2(B) is a schematic diagram illustrating a test assembly 3 and an image capture card 4 according to the comparative example. The structure of the test assembly 3 and the image capture card 4 of the comparative example is similar to that of the first embodiment, but the test assembly 3 of the comparative example does not have the test signal clock generation circuit 80, and the image capture card 4 of the comparative example has a clock generator 440.

As shown in FIG. 2(B), because the test assembly 3 of the comparative example does not have the test signal clock generation circuit 80, the test assembly 3 of the comparative example only transmits the test signal S0 to the image capture card 4 of the comparative example, such that the logic processing unit 44 of the comparative example needs to use a predetermined clock clk0 of the test signal S0 generated by the clock generator 440 to obtain the image data. However, due to the predetermined clock clk0 generated by the clock generator 440 is a predetermined value, and the predetermined clock clk0 may not correspond to the delay of the test signal S0 occurred on the transmission path, so a phase difference may still exist between the timing of the predetermined clock clk0 and the timing of the test signal S0. Such that a signal jitter problem of the image data obtained by the logic processing unit 44 may be encountered, so that the effective bandwidth of the signal (e.g. the image data) may be reduced, and the quality of the image data may be decreased. To solve this problem, the logic processing unit 44 needs to have more processing units or needs more complicated algorithms, which however may increase the manufacture cost.

In comparison, the test signal clock generation circuit 80 in the invention obtains the test signal clock CLK directly from the test signal S0 and, when the transmission process of the test signal S0 is delayed, the phase of the test signal clock CLK from the test signal S0 is also delayed. Therefore, the timing of the test signal clock CLK is substantially corresponding to the timing of the test signal S0. Thus, the problem caused by the phase difference can be avoided, and the quality of the image data can be increased.

Figure 3:
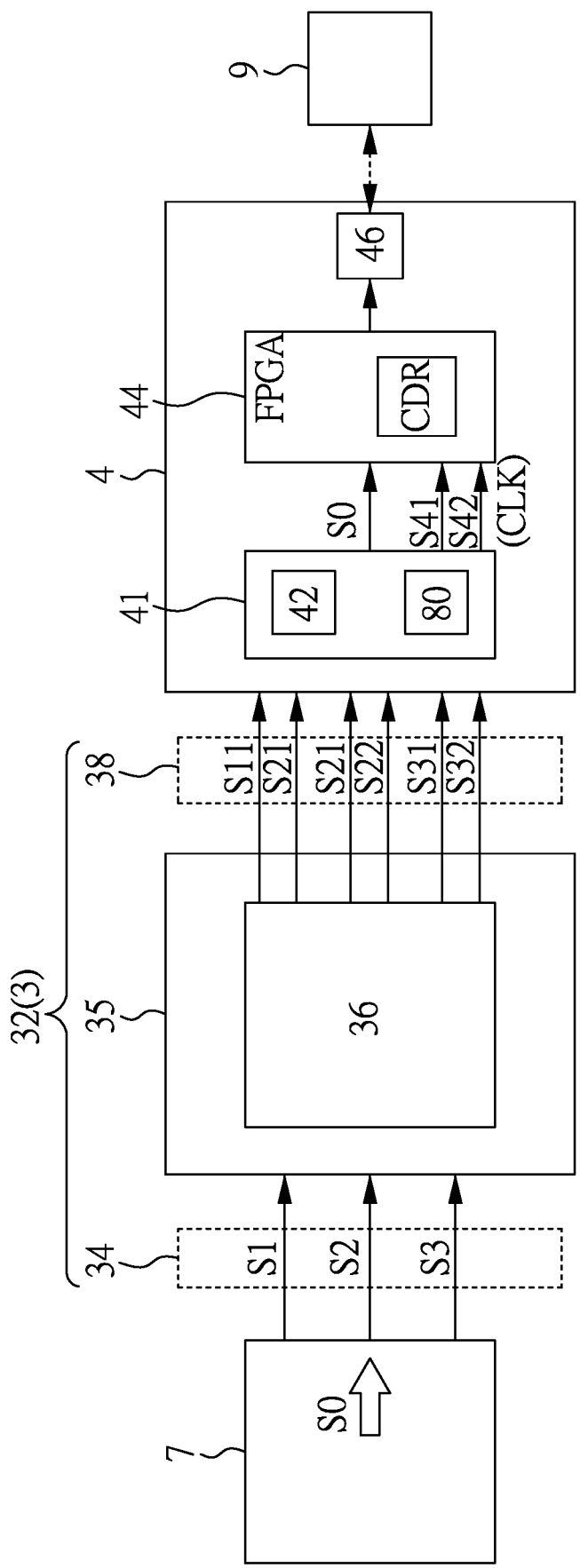
FIG. 3 is a schematic diagram illustrating the detail structure of the test assembly and the image capture card according to a second embodiment of the invention.

The present invention may have different implementations. FIG. 3 is a schematic diagram illustrating the detail structure of the test assembly 3 and the image capture card 4 according to a second embodiment of the invention. Please refer FIG. 3 as well as FIGS. 1 and 2(A). The second embodiment of FIG. 3 is similar to the first embodiment of FIG. 2(A) except that the test signal clock generation circuit 80 is arranged in the image capture card 4.

As shown in FIG. 3, the test signal clock generation circuit 80 is arranged in the logic input interface 41. In one embodiment, the test assembly 3 transmits the test signal S0 (e.g. S11 and S12, S21 and S22, S31 and S32) in the second signal transmission form to the logic input interface 41. The data conversion circuit 42 may convert the test signal S0 from the second signal transmission form into a data form suitable for the logic processing unit 44, and transmit the converted test signal S0 to the logic processing unit 44. Besides, the data conversion circuit 42 may convert the test signal S0 from the second signal transmission form into the first signal transmission form, and transmit the converted test signal S0 to the test signal clock generation circuit 80. The test signal clock generation circuit 80 may obtain the test signal clock CLK from the test signal S0, and transmit the test signal clock CLK to the logic processing unit 44, wherein the test signal S0 may be transmitted to the logic processing unit 44 through the data conversion circuit 42. In another embodiment, the data conversion circuit 42 converts the test signal S0 from the second signal transmission form into the first signal transmission form, and transmits the converted test signal S0 to the test signal clock generation circuit 80. The test signal clock generation circuit 80 then transmits the obtained test signal clock CLK and the test signal S0 to the logic processing unit 44; i.e. the test signal S0 is transmitted to the logic processing unit 44 through the test signal clock generation circuit 80. Subsequently, the logic processing unit 44 decodes the test signal S0 according to the test signal S0 and the test signal clock CLK so as to obtain the image data. Because the test signal clock CLK is obtained from the test signal S0, the timing of the test signal clock CLK may correspond to that of the test signal S0, so that the image data may be provided with good quality.

In this embodiment, the logic processing unit 44 is a FPGA chip with sufficient pins for receiving the test signal S0 and the test signal clock CLK, so that there are no additional pins required to be added to the logic processing unit 44.

Figure 4:
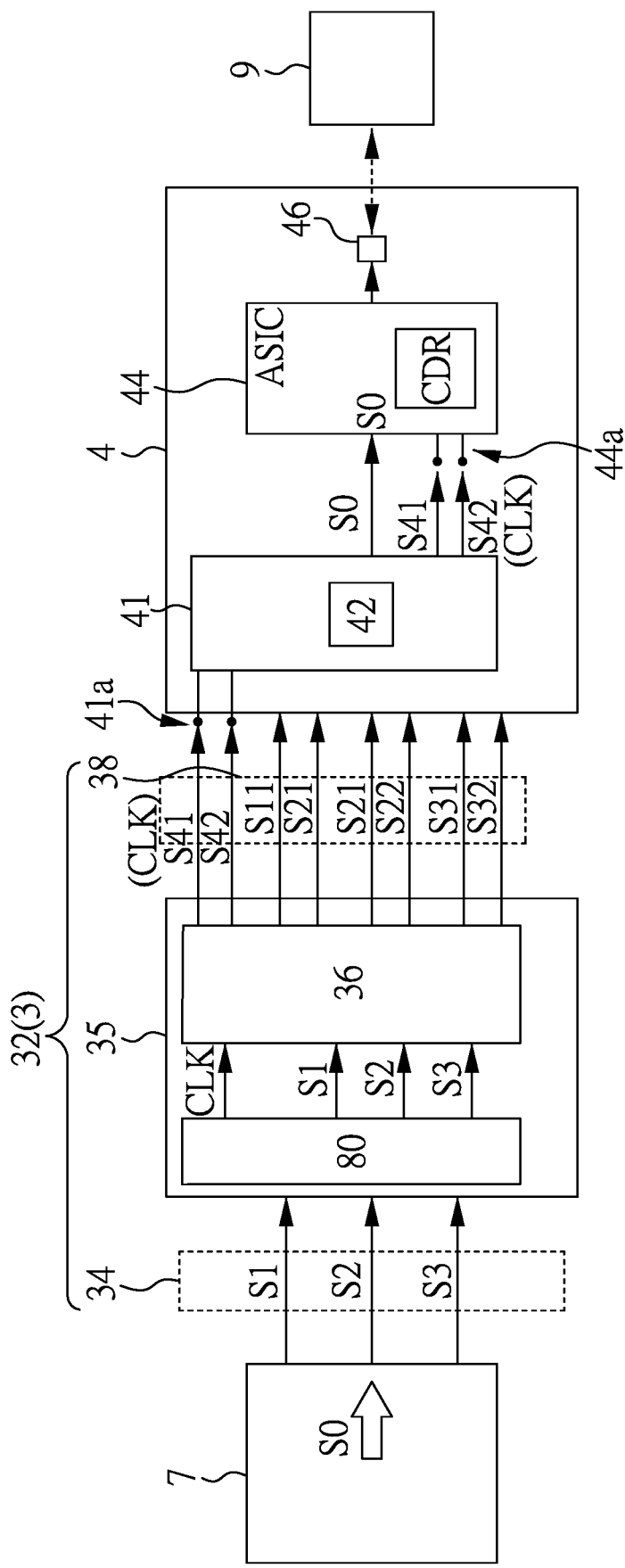
FIG. 4 is a schematic diagram illustrating the detail structure of the test assembly and the image capture card according to a third embodiment of the invention.

The present invention may be implemented in different manners. FIG. 4 is a schematic diagram illustrating the detail structure of the test assembly 3 and the image capture card 4 according to a third embodiment of the invention. Please refer to FIG. 4 as well as FIGS. 1 and 2(A).

The third embodiment of FIG. 4 is similar to the first embodiment of FIG. 2(A) except that the logic processing unit 44 of the third embodiment is a customization chip (such as an application specific integrated circuit, ASIC chip). When the logic processing unit 44 is an ASIC, additional pins 44a can be added (e.g. a pair of additional pins can be added to the logic processing unit 44) for receiving the test signal clock CLK from the data conversion circuit 42.

Figure 5:
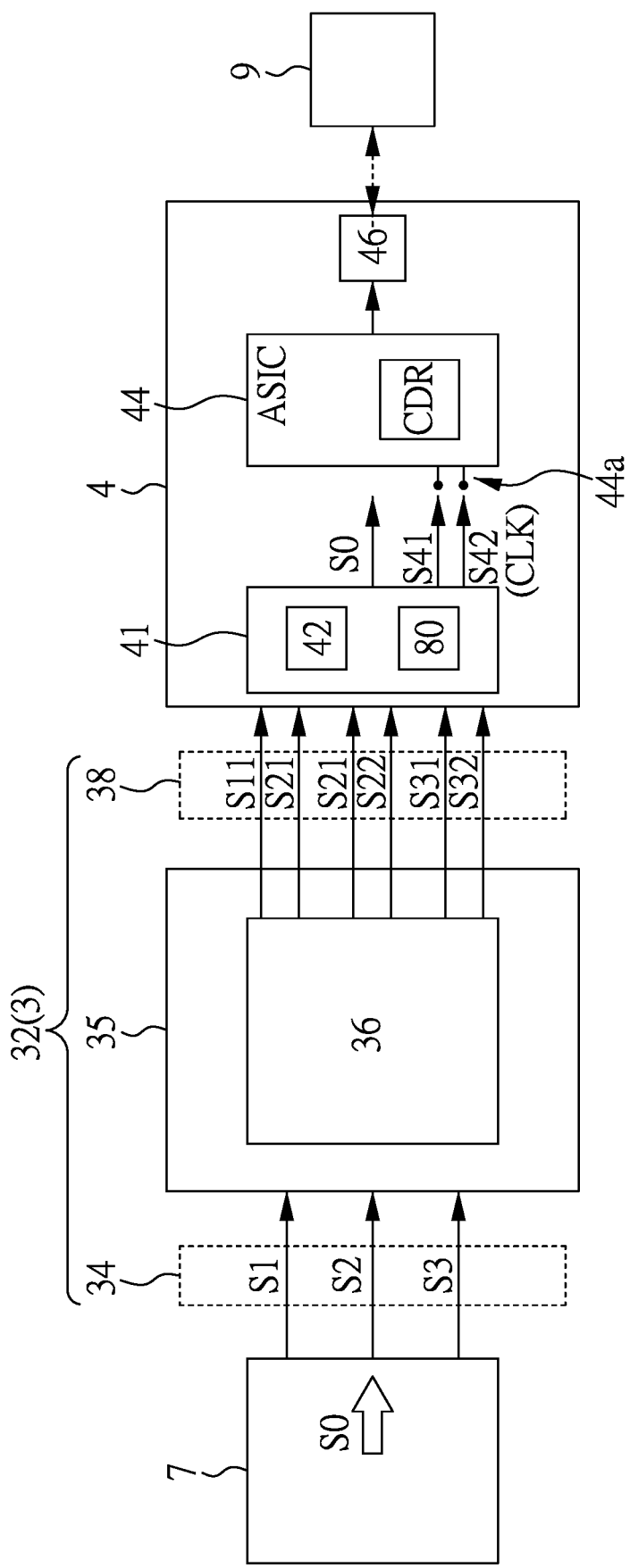
FIG. 5 is a schematic diagram illustrating the detail structure of the test assembly and the image capture card according to a fourth embodiment of the invention.

The present invention may be implemented in different manners. FIG. 5 is a schematic diagram illustrating the detail structure of the test assembly 3 and the image capture card 4 according to the fourth embodiment of the invention. Please refer to FIG. 5 as well as FIGS. 1 to 4.

The fourth embodiment of FIG. 5 is similar to the second embodiment of FIG. 3 except that the logic processing unit 44 of the fourth embodiment is a customization chip (such as an application specific integrated circuit, ASIC chip). Because the logic processing unit 44 of this embodiment is an ASIC chip, additional pins (e.g. a pair of additional pins) can be added for receiving the test signal clock CLK from the test signal clock generation circuit 80.

Figure 6A:
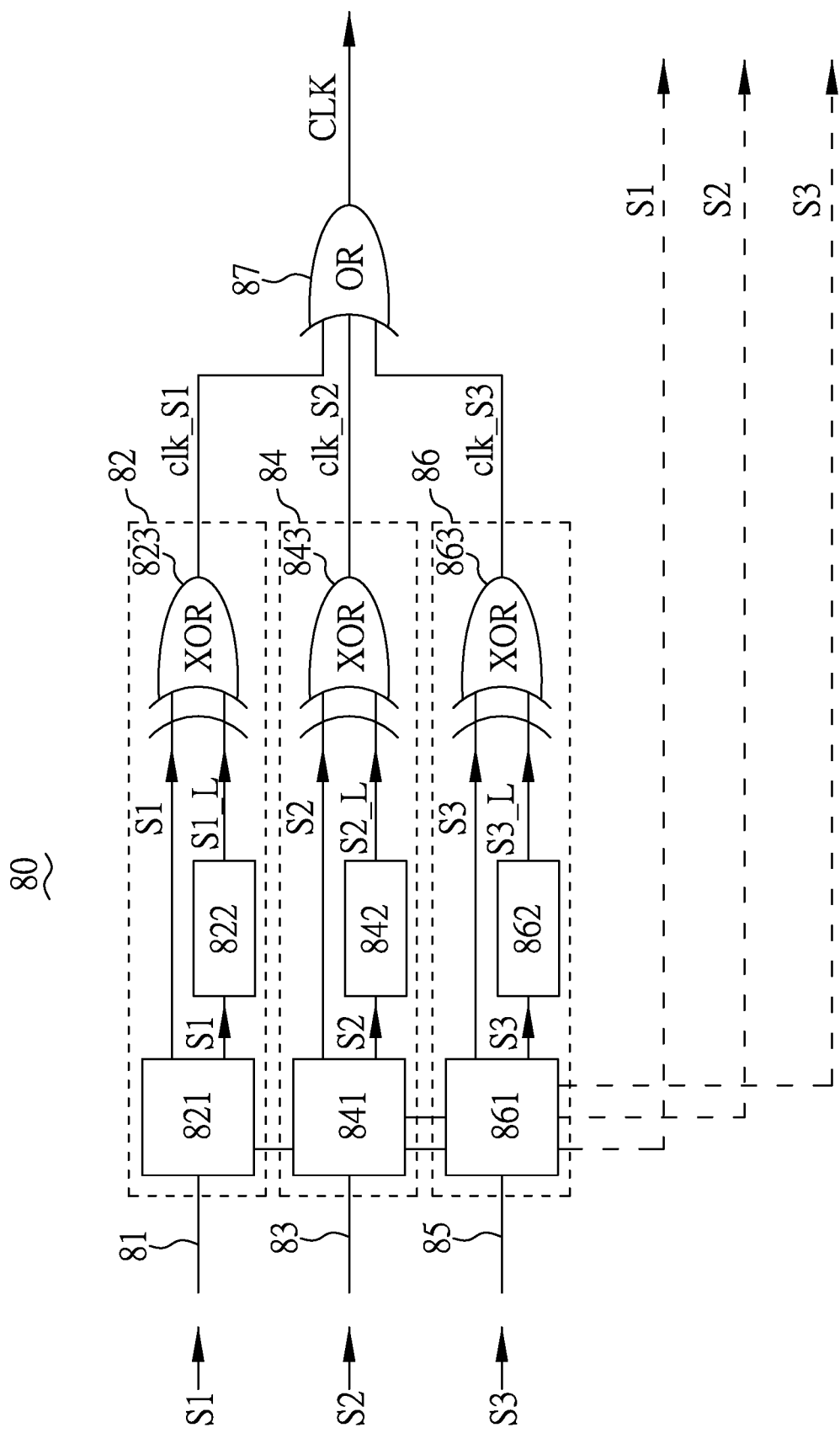
FIG. 6(A) is a circuit diagram of a test signal clock generation circuit according to an embodiment of the invention.
Figure 6B:
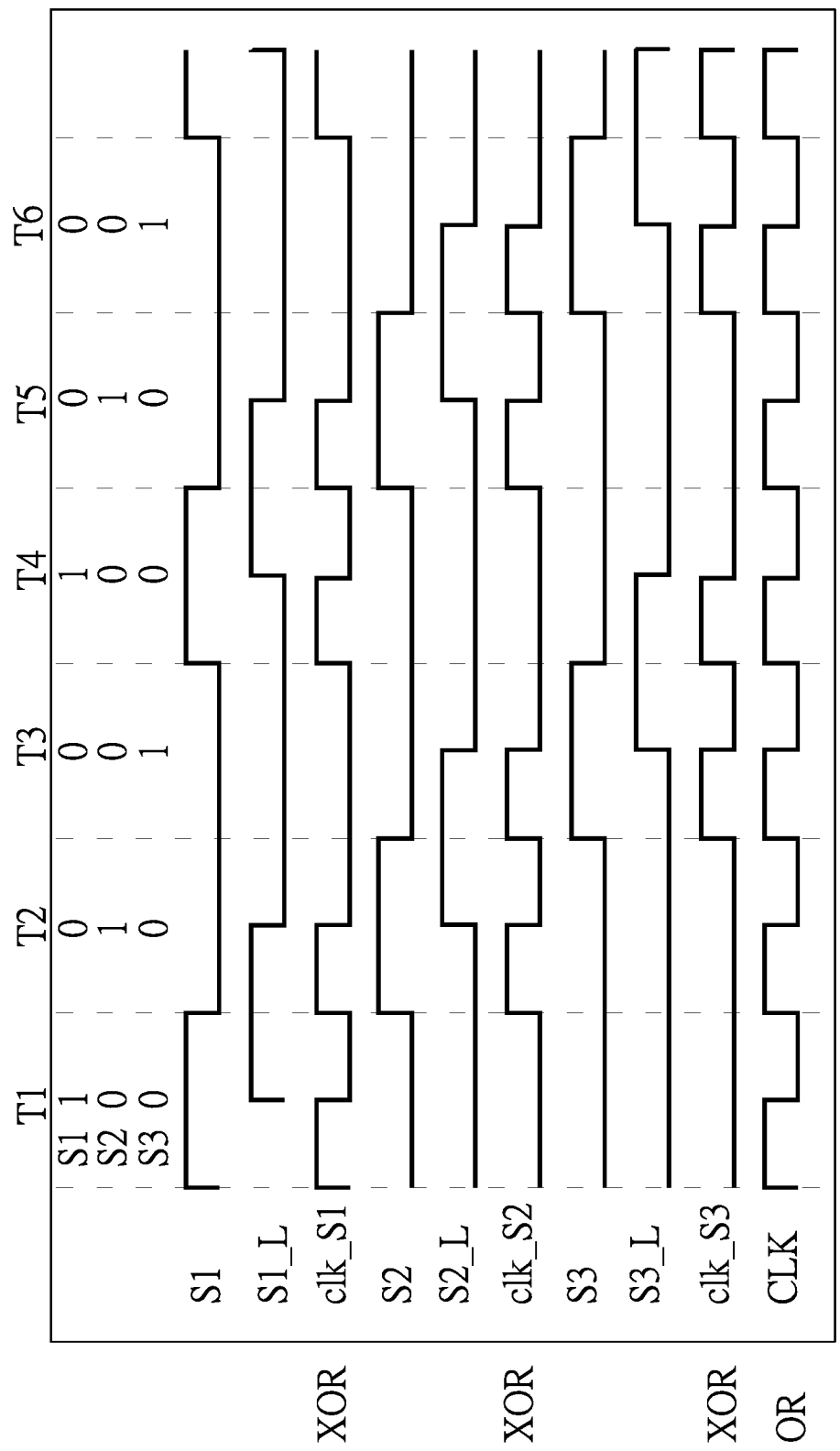
FIG. 6(B) is a timing diagram for a sub-signal of the test signal according to an embodiment of the invention.

Besides, to more clearly illustrate the present invention, the detail of the test signal clock generation circuit 80 is described as follows. FIG. 6(A) is a circuit diagram of the test signal clock generation circuit 80 according to an embodiment of the invention. FIG. 6(B) is a timing diagram of a sub-signal of a test signal S0 according to an embodiment of the invention. Please refer to FIGS. 6(A) and 6(B) as well as FIGS. 1 to 5.

As shown in FIG. 6(A), the test signal clock generation circuit 80 comprises a first input terminal 81, a first clock obtaining module 82, a second input terminal 83, a second clock obtaining module 84, a third input terminal 85, a third clock obtaining module 86 and a circuit output terminal 87. The first input terminal 81 is connected to the first clock obtaining module 82. The second input terminal 83 is connected to the second clock obtaining module 84. The third input terminal 85 is connected to the third clock obtaining module 86. The first clock obtaining module 82, the second clock obtaining module 84 and the third clock obtaining module 86 are respectively connected to the circuit output terminal 87.

The first input terminal 81 is provided for obtaining the first sub-signal S1 of the test signal S0 (in the first signal transmission form).

The first clock obtaining module 82 is provided for obtaining a first sub-signal clock clk_s1 from the first sub-signal S1, and transmitting the first sub-signal clock clk_s1 to the circuit output terminal 87. The second input terminal 83 is provided for obtaining the second sub-signal S2 of the test signal S0. The second clock obtaining module 84 is provided for obtaining a second sub-signal clock clk_s2 from the second sub-signal S2, and transmitting the second sub-signal clock clk_s2 to the circuit output terminal 87. The third input terminal 85 is provided for obtaining the third sub-signal S3 of the test signal S0. The third clock obtaining module 86 is provided for obtaining a third sub-signal clock clk_s3 from the third sub-signal S3, and transmitting the third sub-signal clock clk_s3 to the circuit output terminal 87. The circuit output terminal 87 is provided for integrating the first sub-signal clock clk_s1, the second sub-signal clock clk_s2 and the third sub-signal clock clk_s3 to form the test signal clock CLK.

In one embodiment, the first clock obtaining module 82 comprises a first buffer 821, a first delay unit 822 and a first XOR gate 823. The first buffer 821 comprises at least two output terminals, wherein one of the output terminals is connected to the first XOR gate 823, and the other one is connected to the first delay unit 822. The first XOR gate 823 comprises two input terminals, wherein one of the input terminals is connected to the first buffer 821, and the other one is connected to the first delay unit 822. The first XOR gate 823 comprises an output terminal connected to the circuit output terminal 87.

Furthermore, the first buffer 821 is provided for obtaining the first sub-signal S1 from the first input terminal 81, and transmitting the first sub-signal S1 to the first delay unit 822 and the first XOR gate 823. The delay unit 822 is provided for converting the first sub-signal S1 into a first delay sub-signal S1_L, and transmitting the first delay sub-signal S1_L to the first XOR gate 823. The first XOR gate 823 is provided for performing an XOR operation on the first sub-signal S1 and the first delay sub-signal S1_L so as to generate the first sub-signal clock clk_s1. In one embodiment, the delay degree of the first delay sub-signal S1_L can be preset by a user through the first delay unit 822. In one embodiment, the first delay sub-signal S1_L is delayed by at least ¼ period in comparison with the first sub-signal S1, or the first delay sub-signal S1_L is delayed by at least ½ period in comparison with the first sub-signal S1, though it is not intended to be so limited.

In one embodiment, the second clock obtaining module 84 comprises a second buffer 841, a second delay unit 842 and a second XOR gate 843. The second buffer 841 comprises at least two output terminals, wherein one of the output terminals of the second buffer 841 is connected to the second XOR gate 843, and the other one is connected to the second delay unit 842. The second XOR gate 843 comprises two input terminals, wherein one of the input terminals of the second XOR gate 843 is connected to the second buffer 841, and the other one is connected to the second delay unit 842. An output terminal of the second XOR gate 843 is connected to the circuit output terminal 87.

Furthermore, the second buffer 841 is provided for obtaining the second sub-signal S2 from the second input terminal 83, and transmitting the second sub-signal S2 to the second delay unit 842 and the second XOR gate 843. The second delay unit 842 is provided for converting the second sub-signal S2 into a second delay sub-signal S2_L, and transmitting the second delay sub-signal S2_L to the second XOR gate 843. The second XOR gate 843 is provided for performing an XOR operation on the second sub-signal S2 and the second delay sub-signal S2_L so as to generate the second sub-signal clock clk_s2. In one embodiment, the delay degree of the second delay sub-signal S2_L can be preset by the user through the second delay unit 842. In one embodiment, the second delay sub-signal S2_L is delayed by at least ¼ period in comparison with the second sub-signal S2, or the second delay sub-signal S2_L is delayed by at least ½ period in comparison with the second sub-signal S2, though it is not intended to be so limited.

In one embodiment, the third clock obtaining module 86 comprises a third buffer 861, a third delay unit 862 and a third XOR gate 863. The third buffer 861 comprises at least two output terminals, wherein one of the output terminals of the third buffer 861 is connected to the third XOR gate 863, and the other one is connected to the third delay unit 862. The third XOR gate 863 comprises two input terminals, wherein one of the input terminals of the third XOR gate 863 is connected to the third buffer 861, and the other one is connected to the third delay unit 862. An output terminal of the third XOR gate 863 is connected to the circuit output terminal 87.

Furthermore, the third buffer 861 is provided for obtaining the third sub-signal S3 from the third input terminal 85, and transmitting the third sub-signal S3 to the third delay unit 862 and the third XOR gate 863. The third delay unit 862 is provided for converting the third sub-signal S3 into a third delay sub-signal S3_L, and transmitting the third delay sub-signal S3_L to the third XOR gate 863. The third XOR gate 863 is provided for performing an XOR operation on the third sub-signal S3 and the third delay sub-signal S3_L so as to generate the third sub-signal clock clk_s3. In one embodiment, the delay degree of the third delay sub-signal S3_L can be preset by the user through third delay unit 862. In one embodiment, the third delay sub-signal S3_L is delayed by at least ¼ period in comparison with the third sub-signal S3, or the third delay sub-signal S3_L is delayed by at least ½ period in comparison with the third sub-signal S3, though it is not intended to be so limited.

In one embodiment, the circuit output terminal 87 may be an OR gate for performing an OR operation on the first sub-signal clock clk_s1, the second sub-signal clock clk_s2 and the third sub-signal clock clk_s3.

In one embodiment, the first delay unit 822, the second delay unit 842 and the third delay unit 862 can be implemented by an electronic circuit with signal delay function, though it is not intended to be so limited.

In one embodiment, if the test signal clock generation circuit 80 is used to output the test signal S0, the first buffer 821, the second buffer 841 and the third buffer 861 each may be provided with an additional output terminal for outputting the first sub-signal S1, the second sub-signal S2 and the third sub-signal S3.

Now, with reference to FIG. 6(B), the detail process for obtaining the test signal clock CLK is described as follows.

As shown in FIG. 6(B), the first sub-signal S1 of the test signal S0 has a high voltage level in a first period T1 (i.e. the data is valid in the first period T1), and the first sub-signal S1 is converted by the first delay unit 842 to form the first delay sub-signal S1_L, wherein the timing of the first delay sub-signal S1_L is delayed ½ period in comparison with the timing of the first sub-signal S1 and thus, when the first XOR gate 823 performs the XOR operation on the first sub-signal S1 and the first delay sub-signal S1_L to generate the first sub-signal clock clk_s1, the first sub-signal clock clk_s1 has a high voltage level corresponding to the first half of the first period T1, and has a low voltage level corresponding to the second half of the first period T1. Similarly, the timing of a fourth period T4 can be derived. Thus, the obtaining process of the first sub-signal clock clk_s1 can be realized.

Similarly, the second sub-signal S2 of the test signal S0 has a high voltage level in a second period T2, and the second sub-signal S2 is converted by the second delay unit 842 to form the second delay sub-signal S2_L, wherein the timing of the second delay sub-signal S2_L is delayed half period in comparison with the timing of the second sub-signal S2 and thus, when the XOR operation is performed on the second sub-signal S2 and the second delay sub-signal S2_L, the second sub-signal clock clk_s2 has a high voltage level corresponding to first half of the second period T2, and the second sub-signal clock clk_s2 has a low voltage level corresponding to second half of the second period T2. Similarly, the timing of a fifth period T5 can be derived. Thus, the obtaining process of the second sub-signal clock clk_s2 can be realized.

The obtaining process of the third sub-signal clock clk_s3 can be realized according to the obtaining processes of the first sub-signal clock clk_s1 and the second sub-signal clock clk_s2, and thus a detail description is deemed unnecessary.

When the circuit output terminal 87 performs an OR operation on the first sub-signal clock clk_s1, the second sub-signal clock clk_s2 and the third sub-signal clock clk_s3, the first sub-signal clock clk_s1, the second sub-signal clock clk_s2 and the third sub-signal clock clk_s3 are combined to form the test signal clock CLK. Thus, the forming process of the test signal clock CLK and the operation of the test signal clock generation circuit 80 can be realized.

Figure 7:
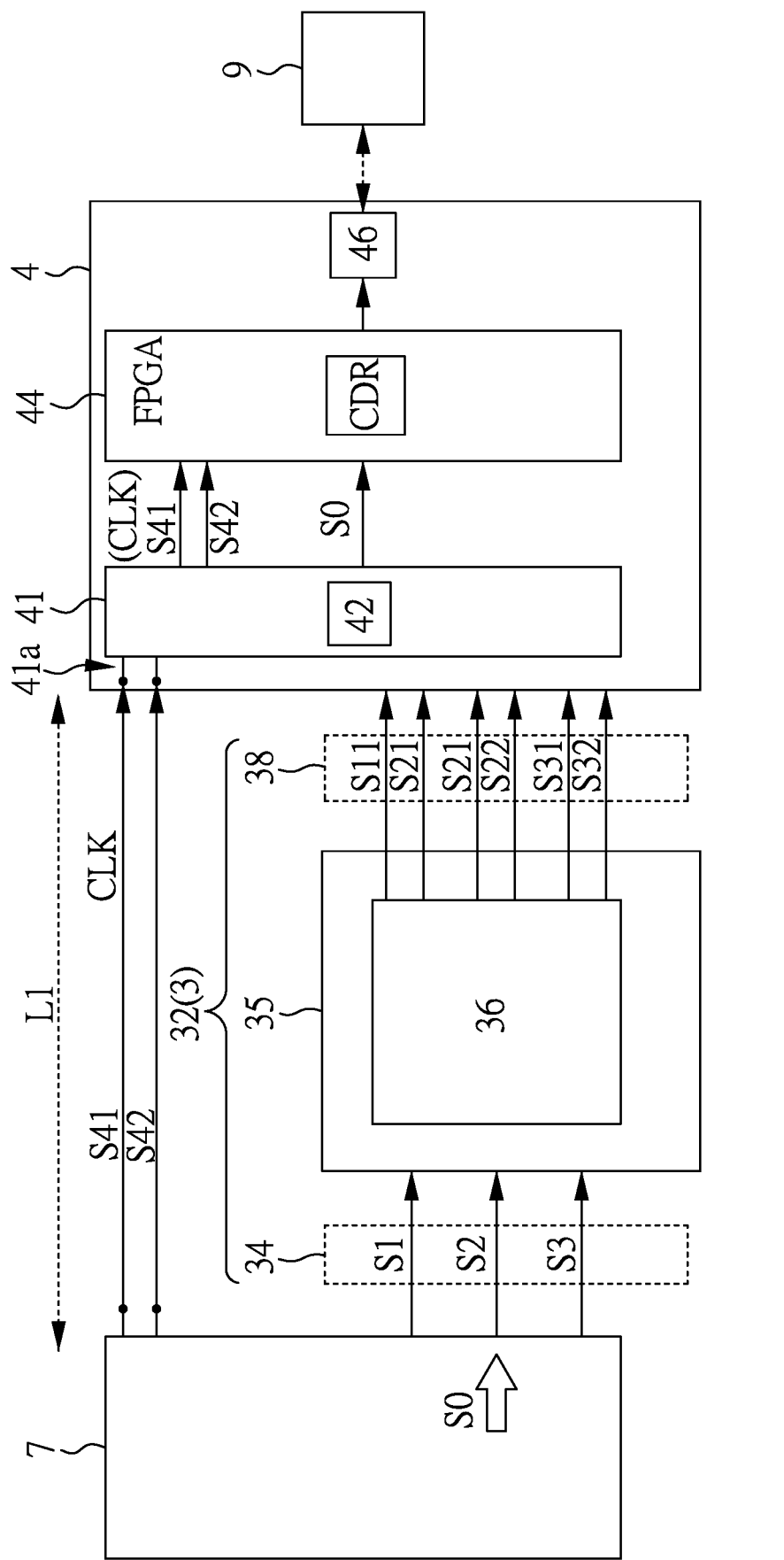
FIG. 7 is a schematic diagram illustrating the detail structure of the test assembly and the image capture card according to a fifth embodiment of the invention.

Next, another embodiment of the invention is described. The present invention may not be provided with the test signal clock generation circuit 80 when the test object 7 itself provides the test signal clock CLK. FIG. 7 is a schematic diagram illustrating the detail structure of the test assembly 3 and the image capture card 4 according to a fifth embodiment of the invention. Please refer to FIG. 7 as well as FIGS. 1 to 6(B).

As shown in FIG. 7, there is no test signal clock generation circuit 80 in both the test assembly 3 and the image capture card 4. The image capture card 4 has a pair of additional clock input pins 41a electrically connected to the test object 7 for receiving the test signal clock CLK from the test object 7. It is noted that, in this embodiment, the test object 7 itself is able to provide the test signal clock CLK, that is, the test object 7 has a pair of additional differential output terminals for outputting the test signal clock CLK (S41, S42) to the image capture card 4.

In this embodiment, the logic processing unit 44 is FPGA with sufficient pins for receiving the test signal S0 and the test signal clock CLK, thus the logic processing unit 44 doesn't need to add the additional pins.

Furthermore, FIG. 7 may be regarded as an equivalent schematic diagram illustrating the arrangement of the components according to the present invention, in which a signal transmission distance of the test signal clock CLK from the test object 7 to the image capture card 4 (e.g. L1) is substantially equal to (or similar to) a signal transmission distance of the test signal S0 from the test object 7 through the test assembly 3 to the image capture card 4 (e.g. L2), and thus the delay generated during the transmission process of the test signal S0 is similar to the delay generated during the transmission process of the test signal clock CLK. Therefore, the phase difference between the test signal S0 and the test signal clock CLK when being processed by the logic processing unit 44 can be reduced, so that the quality of the image data obtained from the test signal S0 can be good.

In one embodiment, "transmission distance A1 is substantially equal to transmission distance B1" means that difference degree between transmission distance A1 and transmission distance B1 is less than 20% (≤20%). In one embodiment, "transmission distance A1 is substantially equal to transmission distance B1" means that difference degree between transmission distance A1 and transmission distance B1 is less than 10% (≤10%). In one embodiment, "transmission distance A1 is substantially equal to transmission distance B1" means that difference degree between transmission distance A1 and transmission distance B1 is less than 5% (≤5%). However, the present invention is not intended to be so limited.

Figure 8:
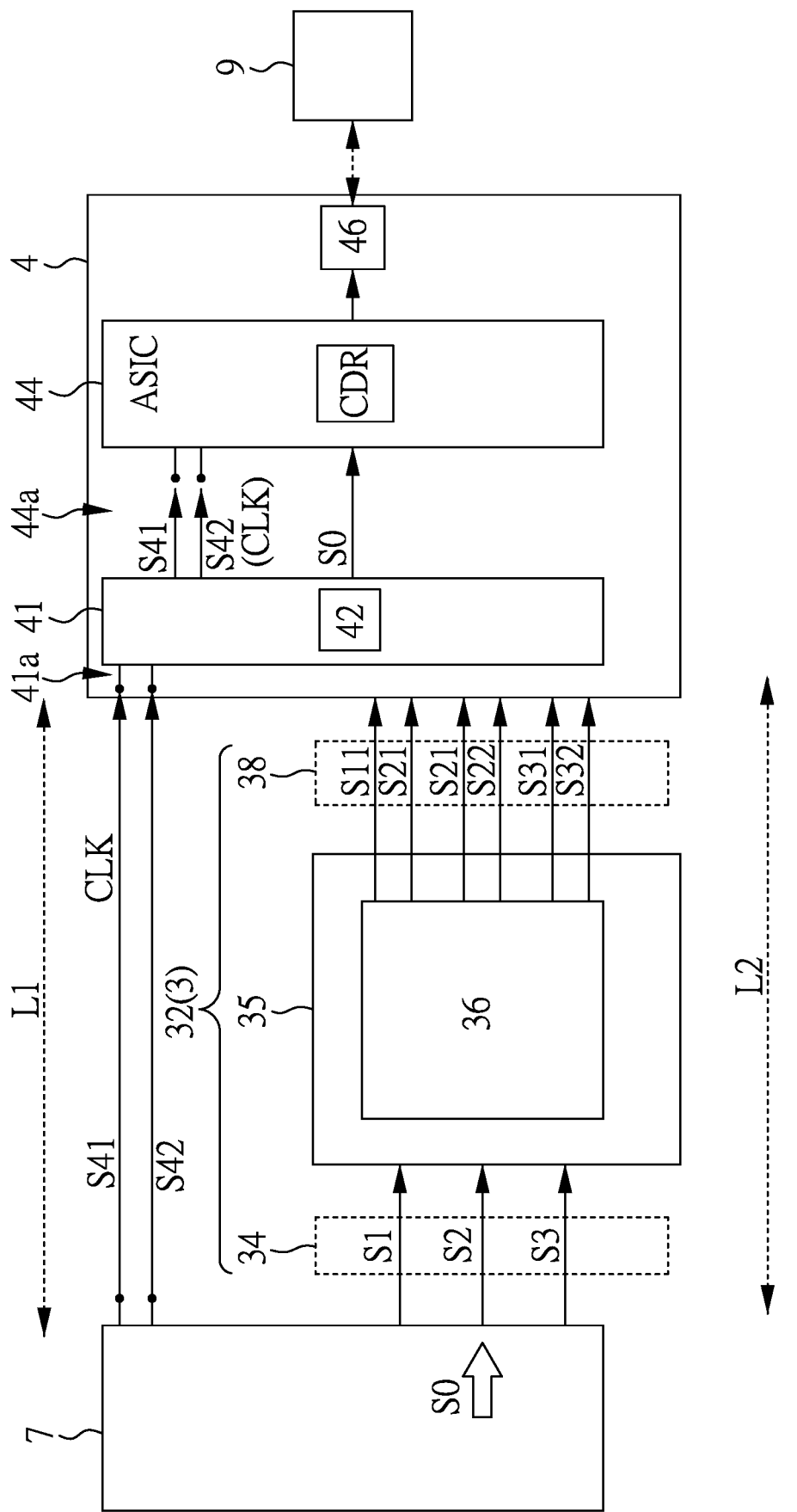
FIG. 8 is a schematic diagram illustrating the detail structure of the test assembly and the image capture card according to a sixth embodiment of the invention.

FIG. 8 is a schematic diagram illustrating the detail structure of the test assembly 3 and the image capture card 4 according to a sixth embodiment of the invention. Please refer to FIG. 8 as well as FIGS. 1 to 7.

The sixth embodiment of FIG. 8 is similar to the fifth embodiment of FIG. 7 except that the logic processing unit 44 of the sixth embodiment is an ASIC, and thus it is provided with a pair of additional pins for receiving the test signal clock CLK.

Similar to the fifth embodiment of FIG. 7, in this embodiment, the transmission distance of the test signal S0 is substantially equal to the transmission distance of test signal clock CLK, and thus the quality of the image data obtained from the test signal S0 can be good.

It is understood that the aforementioned configuration is provided for illustrative purpose only and there may be more configurations available between the test assembly 3 and the image capture card 4.

As a result, the present invention provides an improved image test system, test assembly and image capture card to reduce the phase difference between the test signal and the test signal clock, so as to solve the problem of limited signal bandwidth, reduce the costs and improve the quality of image data.

Although the present invention has been explained in relation to its preferred embodiment, it is to be understood that many other possible modifications and variations can be made without departing from the spirit and scope of the invention as hereinafter claimed.

What is claimed is:

1. An image test system, comprising:
a test assembly for obtaining a test signal from a test object, wherein the test assembly comprises an interface conversion circuit for converting signal transmission form of the test signal; and
an image capture card for obtaining the test signal from the test assembly, and obtaining an image data from the test signal,
wherein the image test system further comprises a test signal clock generation circuit for obtaining a test signal clock from the test signal,
wherein the test signal comprises a first sub-signal, a second sub-signal and a third sub-signal, and the test signal clock generation circuit comprises a first input terminal, a first clock obtaining module, a second input terminal, a second clock obtaining module, a third input terminal, a third clock obtaining module and a circuit output terminal, and wherein the first input terminal is provided for obtaining the first sub-signal, the first clock obtaining module is provided for obtaining a first sub-signal clock from the first sub-signal and transmitting the first sub-signal clock to the circuit output terminal, the second input terminal is provided for obtaining the second sub-signal, the second clock obtaining module is provided for obtaining a second sub-signal clock from the second sub-signal and transmitting the second sub-signal clock to the circuit output terminal, the third input terminal is provided for obtaining the third sub-signal, the third clock obtaining module is provided for obtaining a third sub-signal clock from the third sub-signal and transmitting the third sub-signal clock to the circuit output terminal, and the circuit output terminal is provided for combining the first sub-signal clock, the second sub-signal clock and the third sub-signal clock to form the test signal clock.

2. The image test system as claimed in claim 1, wherein the test signal clock generation circuit is arranged in the test assembly or the image capture card.

3. The image test system as claimed in claim 1, wherein the circuit output terminal is provided with an OR gate.

4. The image test system as claimed in claim 3, wherein the first clock obtaining module comprises a first buffer, a first delay unit and a first XOR gate, and wherein the first buffer is provided for obtaining the first sub-signal from the first input terminal, and transmitting the first sub-signal to the first delay unit and the first XOR gate, the first delay unit is provided for converting the first sub-signal into a first delay sub-signal and transmitting the first delay sub-signal to the first XOR gate, and the first XOR gate is provided for performing an XOR operation on the first sub-signal and the first delay sub-signal to form the first sub-signal clock.

5. The image test system as claimed in claim 4, wherein the second clock obtaining module comprises a second buffer, a second delay unit and a second XOR gate, and the third clock obtaining module comprises a third buffer, a third delay unit and a third XOR gate, and wherein the second buffer is provided for obtaining the second sub-signal from the second input terminal, and transmitting the second sub-signal to the second delay unit and the second XOR gate, the second delay unit is provided for converting the second sub-signal into a second delay sub-signal, and transmitting the second delay sub-signal to the second XOR gate, the second XOR gate is provided for performing an XOR operation on the second sub-signal and the second delay sub-signal to form the second sub-signal clock, the third buffer is provided for obtaining the third sub-signal from the third input terminal and transmitting the third sub-signal to the third delay unit and the third XOR gate, the third delay unit is provided for converting the third sub-signal into a third delay sub-signal, and transmitting the third delay sub-signal to the third XOR gate, and the third XOR gate is provided for performing an XOR operation on the third sub-signal and the third delay sub-signal to form the third sub-signal clock.

6. The image test system as claimed in claim 5, wherein when the test signal clock generation circuit is arranged in the test assembly, the first buffer transmits the first sub-signal to the image capture card, the second buffer transmits the second sub-signal to the image capture card, and the third buffer transmits the third sub-signal to the image capture card.

7. A test assembly arranged in an image test system having an image capture card, comprising:
a first transmission interface for obtaining a test signal from a test object;
a test signal clock generation circuit for obtaining a test signal clock from the test signal, and transmitting the test signal clock to the image capture card;
an interface conversion circuit for converting signal transmission form of the test signal to form a converted test signal; and
a second transmission interface for transmitting the converted test signal to the image capture card,
wherein the test signal comprises a first sub-signal, a second sub-signal and a third sub-signal, and the test signal clock generation circuit comprises a first input terminal, a first clock obtaining module, a second input terminal, a second clock obtaining module, a third input terminal, a third clock obtaining module and a circuit output terminal, and wherein the first input terminal is provided for obtaining the first sub-signal, the first clock obtaining module is provided for obtaining a first sub-signal clock from the first sub-signal and transmitting the first sub-signal clock to the circuit output terminal, the second input terminal is provided for obtaining the second sub-signal, the second clock obtaining module is provided for obtaining a second sub-signal clock from the second sub-signal and transmitting the second sub-signal clock to the circuit output terminal, the third input terminal is provided for obtaining the third sub-signal, the third clock obtaining module is provided for obtaining a third sub-signal clock from the third sub-signal and transmitting the third sub-signal clock to the circuit output terminal, and the circuit output terminal is provided for combining the first sub-signal clock, the second sub-signal clock and the third sub-signal to form the test signal clock.

8. The test assembly as claimed in claim 7, wherein the circuit output terminal is provided with an OR gate.

9. The test assembly as claimed in claim 8, wherein the first clock obtaining module comprises a first buffer, a first delay unit and a first XOR gate, and wherein the first buffer is provided for obtaining the first sub-signal from the first input terminal and transmitting the first sub-signal to the first delay unit and the first XOR gate, the first delay unit is provided for converting the first sub-signal to a first delay sub-signal and transmitting the first delay sub-signal to the first XOR gate, and the first XOR gate is provided for performing an XOR operation on the first sub-signal and the first delay sub-signal to form the first sub-signal clock.

10. The test assembly as claimed in claim 9, wherein the second clock obtaining module comprises a second buffer, a second delay unit and a second XOR gate, and wherein the second buffer is provided for obtaining the second sub-signal from the second input terminal and transmitting the second sub-signal to the second delay unit and the second XOR gate, the second delay unit is provided for converting the second sub-signal to a second delay sub-signal and transmitting the second delay sub-signal to the second XOR gate, and the second XOR gate is provided for performing an XOR operation on the second sub-signal and the second delay sub-signal to form the second sub-signal clock.

11. The test assembly as claimed in claim 10, wherein the third clock obtaining module comprises a third buffer, a third delay unit and a third XOR gate, and wherein the third buffer is provided for obtaining the third sub-signal from the third input terminal and transmitting the third sub-signal to the third delay unit and the third XOR gate, the third delay unit is provided for converting the third sub-signal to a third delay sub-signal and transmitting the third delay sub-signal to the third XOR gate, and the third XOR gate is provided for performing an XOR operation on the third sub-signal and the third delay sub-signal to form the third sub-signal clock.

12. An image capture card arranged in an image test system having a test assembly configured to obtain a test signal from a test object and provided with an interface conversion circuit for converting signal transmission form of the test signal to form a converted test signal, comprising:
   a test signal clock generation circuit for obtaining the converted test signal from the test assembly, and obtaining a test signal clock from the test signal; and
   a logic processing unit for obtaining an image data from the test signal according to the test signal clock,
   wherein the test signal comprises a first sub-signal, a second sub-signal and a third sub-signal, and the test signal clock generation circuit comprises a first input terminal, a first clock obtaining module, a second input terminal, a second clock obtaining module, a third input terminal, a third clock obtaining module and a circuit output terminal, and wherein the first input terminal is provided for obtaining the first sub-signal, the first clock obtaining module is provided for obtaining a first sub-signal clock from the first sub-signal and transmitting the first sub-signal clock to the circuit output terminal, the second input terminal is provided for obtaining the second sub-signal, the second clock obtaining module is provided for obtaining a second sub-signal clock from the second sub-signal and transmitting the second sub-signal clock to the circuit output terminal, the third input terminal is provided for obtaining the third sub-signal, the third clock obtaining module is provided for obtaining a third sub-signal clock from the third sub-signal and transmitting the third sub-signal clock to the circuit output terminal, and the circuit output terminal is provided for combining the first sub-signal clock, the second sub-signal clock and the third sub-signal to form the test signal clock.

13. The image capture card as claimed in claim 12, wherein the circuit output terminal is provided with an OR gate.

14. The image capture card as claimed in claim 13, wherein the first clock obtaining module comprises a first buffer, a first delay unit and a first XOR gate, and wherein the first buffer is provided for obtaining the first sub-signal from the first input terminal and transmitting the first sub-signal to the first delay unit and the first XOR gate, the first delay unit is provided for converting the first sub-signal to a first delay sub-signal and transmitting the first delay sub-signal to the first XOR gate, and the first XOR gate is provided for performing an XOR operation on the first sub-signal and the first delay sub-signal to output the first sub-signal clock.

15. The image capture card as claimed in claim 14, wherein the second clock obtaining module comprises a second buffer, a second delay unit and a second XOR gate, and wherein the second buffer is provided for obtaining the second sub-signal from the second input terminal and transmitting the second sub-signal to the second delay unit and the second XOR gate, the second delay unit is provided for converting the second sub-signal to a second delay sub-signal and transmitting the second delay sub-signal to the second XOR gate, and the second XOR gate is provided for performing an XOR operation on the second sub-signal and the second delay sub-signal to output the second sub-signal clock.

16. The image capture card as claimed in claim 15, wherein the third clock obtaining module comprises a third buffer, a third delay unit and a third XOR gate, and wherein the third buffer is provided for obtaining the third sub-signal from the third input terminal and transmitting the third sub-signal to the third delay unit and the third XOR gate, the third delay unit is provided for converting the third sub-signal to a third delay sub-signal and transmitting the third delay sub-signal to the third XOR gate, and the third XOR gate is provided for performing an XOR operation on the third sub-signal and the third delay sub-signal to output the third sub-signal clock.

\* \* \* \* \*